United States Patent
Tavakoli Dastjerdi et al.

(10) Patent No.: US 7,532,072 B1
(45) Date of Patent: May 12, 2009

(54) METHOD TO CONTROL THE OUTPUT COMMON MODE IN A DIFFERENTIAL OPAMP WITH RAIL-TO-RAIL INPUT STAGE

(75) Inventors: Maziar Tavakoli Dastjerdi, Waltham, MA (US); Kristiaan B. Lokere, Westford, MA (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 11/681,581

(22) Filed: Mar. 2, 2007

(51) Int. Cl.
*H03F 3/45* (2006.01)
(52) U.S. Cl. .................................. 330/258; 330/260
(58) Field of Classification Search ................ 330/252, 330/257, 258, 260, 261
See application file for complete search history.

(56) References Cited

U.S. PATENT DOCUMENTS 4,742,308 A * 5/1988 Banu ........................ 330/258
6,052,025 A * 4/2000 Chang et al. ............... 330/253
7,375,585 B2 * 5/2008 Trifonov et al. ............ 330/258

* cited by examiner

*Primary Examiner*—Henry K Choe
(74) *Attorney, Agent, or Firm*—McDermott Will & Emery LLP

(57) ABSTRACT

A differential amplifier with a rail-to-rail input stage includes a feedback circuit that maintains the output common mode voltage of the amplifier within a narrow range of an externally supplied value. To reduce harmonic distortions and to further stabilize the output common mode voltage of the amplifier, current is controllably drawn from a biasing circuit coupled to an intermediate stage of the amplifier. Optionally, to reduce harmonic distortions and to further stabilize the output common mode voltage of the amplifier, current is controllably supplied to the intermediate stage of the amplifier.

23 Claims, 4 Drawing Sheets

METHOD TO CONTROL THE OUTPUT COMMON MODE IN A DIFFERENTIAL OPAMP WITH RAIL-TO-RAIL INPUT STAGE

BACKGROUND OF THE INVENTION

The present invention relates to electronic circuits, and more particularly to a differential amplifier with a rail-to-rail input stage and a controlled output common mode voltage.

Differential amplifiers are well known and widely used in electronic circuits to amplify the difference between a pair of differential input signals. FIG. 1 is a transistor schematic diagram of a differential amplifier 10, commonly referred to as the emitter-coupled pair. Current source 20 coupled to the emitter terminals of transistors 16 and 18 is used to bias amplifier 10. As is well known, amplifier 10 has a differential mode gain, defined by the difference of the values of the input signals INP and INN, as well as a common mode gain, defined by the average of the values of the input signals INP and INN. Accordingly, output voltage Vout is determined both by the difference as well as the average of the values of the input signals INP and INN.

A differential amplifier may be used as an input stage of an operational amplifier to provide, among other things, a relatively high differential gain, a relatively high common-mode rejection ratio, and a relatively high common mode range. It would be desirable to have a differential amplifier adapted to receive and amplify a rail-to-rail differential input voltage and that is further characterized by a controlled output common mode voltage.

BRIEF SUMMARY OF THE INVENTION

In accordance with one embodiment of the present invention, a differential amplifier with a rail-to-rail input stage includes, in part, a feedback circuit adapted to maintain the output common mode voltage of the amplifier within a narrow range of an externally defined value. To reduce harmonic distortions and further maintain the amplifier's output common mode voltage within a narrow range of the external value, the base-emitter voltages of a pair of transistors disposed in an intermediate stage of the amplifier is maintained substantially constant.

In one embodiment, the amplifier includes, in part, an input stage, an intermediate stage, an output stage, a feedback circuit, and a biasing circuit adapted to bias the intermediate stage. The input stage includes, in part, a first differential amplification stage biased by a first current source, and a second differential amplification stage biased by a second current source. The first and second current sources may be variable or fixed current sources.

In one embodiment, the first amplification stage further includes a pair of NPN transistors forming an emitter-coupled pair amplifier coupled to the Vcc supply voltage via a first pair of resistive loads. In such embodiments, the second amplification stage further includes a pair of PNP transistors forming an emitter-coupled pair amplifier coupled to the ground potential via a second pair of resistive loads. In the embodiments in which the first and second current sources are variable current sources, the amount of currents flowing through the first and second variable current sources are varied by a sensing block and in accordance with the common mode voltage applied to the input stage of the amplifier so as to maintain the sum of these two currents nearly constant.

The intermediate stage includes, in part, first and second transistors responsive to the output signals of the first differential amplification stage, and third and fourth transistors responsive to the output signals of the second differential amplification stage. In one embodiment, the first and second transistors of the intermediate stage are PNP transistors each forming a cascode amplifier with a corresponding transistor in the first amplification stage. In such embodiments, the third and fourth transistors of the intermediate stage are NPN transistors each forming a cascode amplifier with a corresponding transistor in the second amplification stage.

A common terminal of each of the first and third transistors of the intermediate stage is coupled to a first node used to generate a first output voltage of the amplifier. Similarly, a common terminal of each of the second and fourth transistors of the intermediate stage is coupled to a second node used to generate a second output voltage of the amplifier. The amplifier is configured to enable substantially the same current to flow in the first and third transistors of the intermediate stage. Similarly, substantially the same current is enabled to flow in the second and fourth transistors of the intermediate stage.

In one embodiment, the first transistor of the intermediate stage has an emitter terminal coupled to a first terminal of a first resistive load and a collector terminal coupled to the first node. The second transistor of the intermediate stage has an emitter terminal coupled to a first terminal of a second resistive load and a collector terminal coupled to the second node. The first and second transistors of the intermediate stage have a common base terminal. In such embodiments, the third transistor of the intermediate stage has an emitter terminal coupled to a first terminal of a third resistive load and a collector terminal coupled to the first node. The fourth transistor of the intermediate stage has an emitter terminal coupled to a first terminal of a fourth resistive load and a collector terminal coupled to the second node. The third and fourth transistors have a common base terminal configured to receive the feedback signal.

The output stage includes, in part, first and second amplifiers. The first amplifier, which has a negative gain, receives the voltage of the first node disposed in the intermediate stage and generates the first output voltage of the rail-to-rail differential amplifier. The second amplifier, which also has a negative gain, receives the voltage of the second node disposed in the intermediate stage and generates the second output voltage of the rail-to-rail differential amplifier.

The feedback circuit includes an amplifier as well as a network of resistive elements. The network of resistive elements receives the first and second output voltages of the first and second amplifiers of the output stage and generates a voltage representative of the average of the first and second output voltages. The feedback amplifier receives the output voltage of the resistive network and the externally defined voltage, and in response, supplies a feedback signal to maintain the output common mode voltage of the differential amplifier within a narrow range of the externally defined voltage.

In some embodiments, to reduce harmonic distortions and further maintain the differential amplifier's output common mode voltage within a desired range, a current source controlled by the sensing block is used to draw current from the biasing circuit so as to maintain a nearly constant voltage across the base-emitter voltages of the first and second transistors of the intermediate stage. In other embodiments, to reduce harmonic distortions and further maintain the output common mode voltage of the differential amplifier within a desired range, a pair of controlled current sources, each controlled by the sensing block, is used to supply currents to the emitter terminals of the third and fourth transistors disposed in the intermediate stage.

DETAILED DESCRIPTION OF THE INVENTION

In accordance with one embodiment of the present invention, a differential amplifier with a rail-to-rail input stage includes a feedback circuit that maintains the output common mode voltage of the amplifier within a narrow range of an externally supplied voltage. In one embodiment, to reduce harmonic distortions and to further stabilize the output common mode voltage of the amplifier, current is controllably drawn from a biasing circuit coupled to an intermediate stage of the amplifier. In another embodiment, to reduce harmonic distortions and to further stabilize the output common mode voltage of the amplifier, current is controllably supplied to the intermediate stage of the amplifier.

Figure 1:
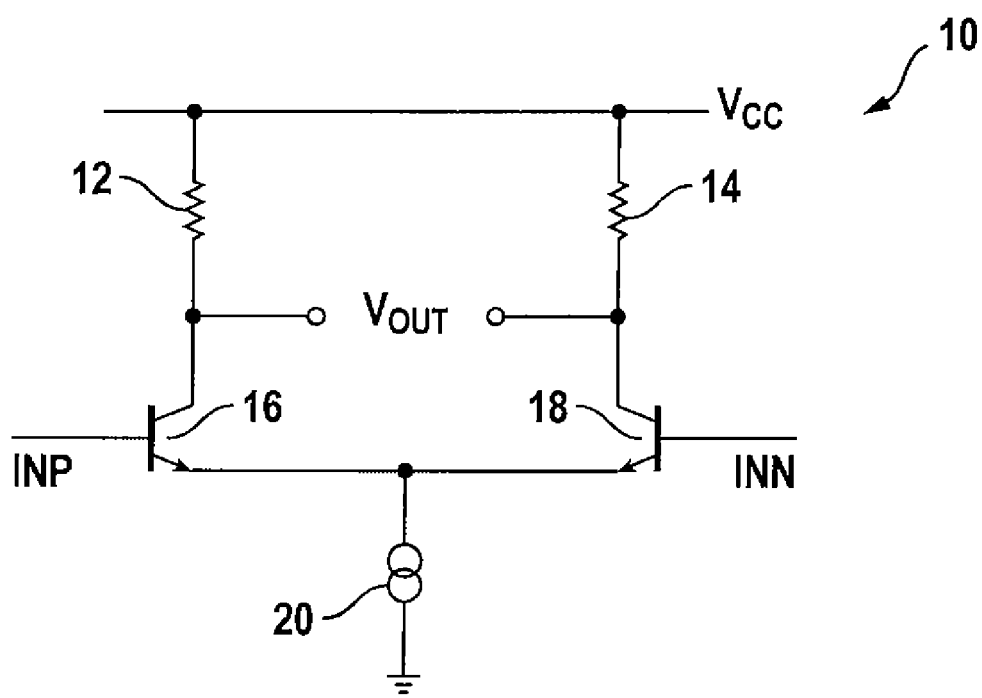
FIG. 1 is a transistor schematic diagram of a differential amplifier, as known in the prior art.
Figure 2:
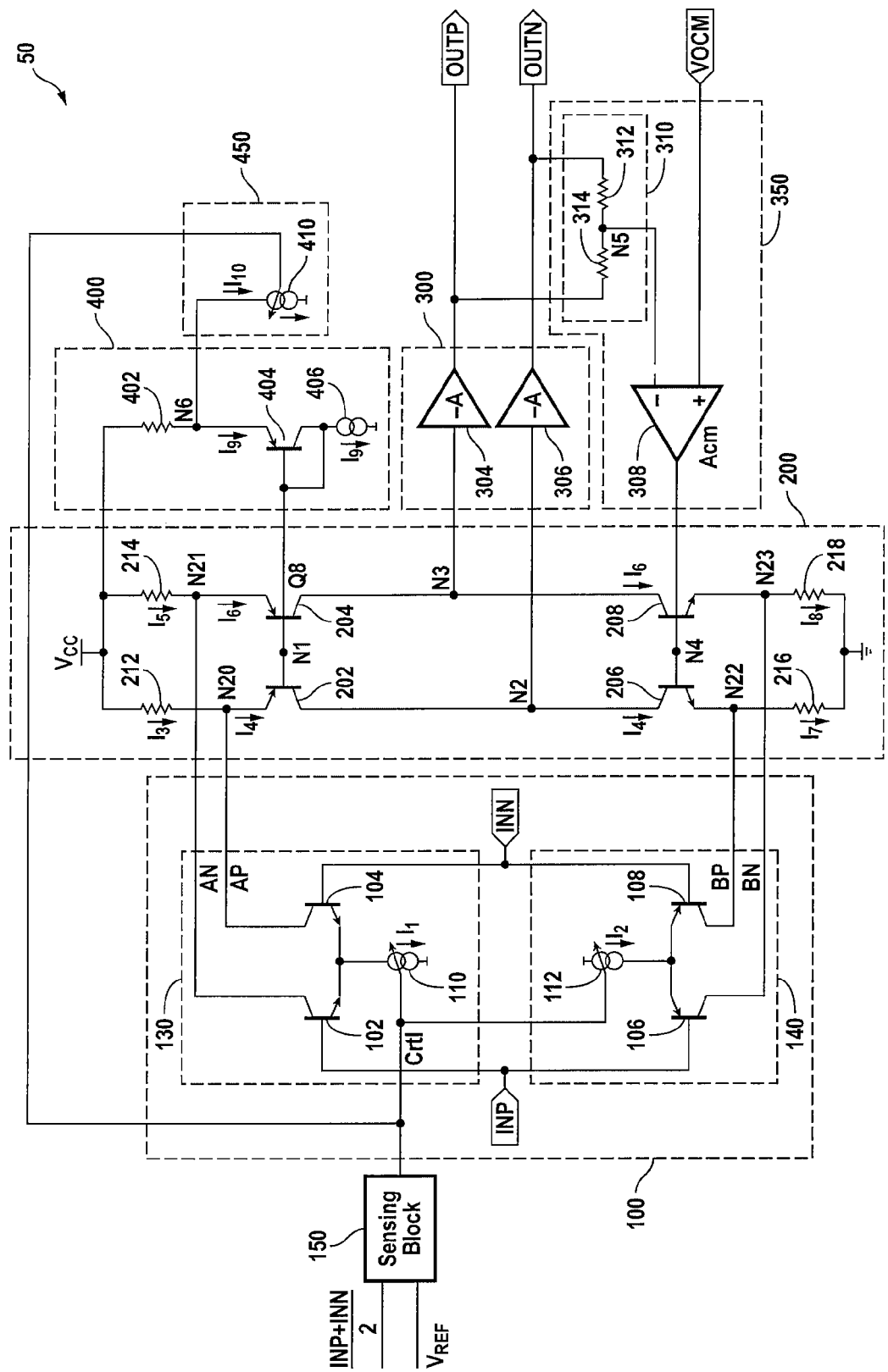
FIG. 2 is a schematic diagram of a differential amplifier with a rail-to-rail input stage, in accordance with one embodiment of the present invention.

FIG. 2 is a transistor schematic diagram of a differential amplifier 50 with a rail-to-rail input stage, in accordance with one embodiment of the present invention. Differential amplifier 50 is shown as including, in part, an input stage 100, an intermediate stage 200, an output stage 300, a feedback circuit 350, a biasing circuit 400, and a controlled current source 450.

Input stage 100 is shown as including first and second emitter-coupled pair amplifiers (amplification stages) 130 and 140. Emitter-coupled pair amplifier 130, in turn, is shown as including NPN bipolar transistors 102, 104, and variable (i.e., controlled) current source 110. Variable current source 110 is used to establish the DC operating point of amplifier 130. Similarly, emitter-coupled pair amplifier 140 is shown as including PNP bipolar transistors 106, 108, and variable current source 112. Variable current source 112 is used to establish the DC operating point of amplifier 140. Differentially positive input signal INP is applied to the base terminals of transistors 102, 106, and differentially negative input signal INN is applied to the base terminals of transistors 104, and 108. In the following description, current sources 110 and 112 are considered as being variable (i.e., controlled) current sources. However, it is understood that the present invention equally applies if current sources 110 and 112 have fixed currents.

As is known, the transconductance, also referred to as gm, of each of the bipolar transistors in input stage 100 is determined, in part, by the current flowing through that transistor. Accordingly, the gm of transistors 102, 104 is determined by current I1 that flows through variable current source 110, and the gm of transistors 106, 108 is determined by current I2 that flows through variable current source 112. Accordingly, if current I1 increases the transconductance of each of transistors 102 and 104 increases, and if current I1 decreases the transconductance of each of transistors 102 and 104 decreases. Similarly, if current I2 increases the transconductance of each of transistors 106 and 108 increases, and if current I2 decreases the transconductance of each of transistors 106 and 108 decreases.

The overall gain of input stage 100 is determined by the transconductances of transistors 102, 104, 106 and 108. If the input common mode voltage applied to input stage 100 is near the supply voltage Vcc, i.e., the first supply rail, PNP transistors 106 and 108 are in non-conductive (off) states and NPN transistors 102 and 104 are in conductive states (on), therefore, the gain of input stage 100 is defined by the transconductances of NPN transistors 102, and 104. Similarly, due to the symmetry of input stage 100, if the input common mode voltage applied to input stage 100 is near the supply voltage Vss, i.e., the second supply rail, NPN transistors 102 and 104 are off and PNP transistors 106 and 108 are on, therefore, the gain of input stage 100 is defined by the transconductances of PNP transistors 106, and 108. As the input common mode voltage applied to input stage 100 approaches the midpoint of the two supply voltages, all four transistors 102, 104, 106 and 108 are turned on, thereby increasing the overall gain of input stage 100. The increase in the gain may result in instability of differential amplifier 50.

To maintain differential amplifier 50 stable under all operating conditions, sensing block 150 compares the input common mode voltage of input stage 100 to a reference voltage Vref, and in response, varies the level of signal Ctrl applied to variable current sources 110 and 112. Signal Ctrl is varied such that the sum of currents I1 and I2 is maintained nearly constant even as the relative sizes of these two currents may vary. Because the sum of currents I1 and I2 is maintained nearly constant, the sum of the transconductances of the PNP and NPN transistors of input stage 100, and hence the overall gain of the input stage 100 remains substantially constant, notwithstanding changes in the input common mode voltage applied to input stage 100. Sensing block 150 is well known and is not described herein. Amplification stage 130 supplies a pair of differential signals AP and AN to intermediate stage 200. Similarly, amplification stage 140 supplies a pair of differential signals BP and BN to intermediate stage 200.

Intermediate (second) stage 200 is shown as including transistors 202, 204, 206 and 208 each of which is configured as a common-base amplifier. Resistors 212 and 214 are respectively disposed between the emitter terminals of transistors 202, 204 and supply voltage Vcc. Similarly, resistors 216 and 218 are respectively disposed between the emitter terminals of transistors 206, 208 and the ground terminal. Output stage 300 is shown as including amplifiers 304 and 306. Biasing circuit 400, shown as including resistor 402, transistor 404 and current source 406, is used to bias transistors 202 and 204. Feedback circuit 350 is adapted to maintain the output common mode voltage of amplifier 50, i.e., the output common mode voltage between terminals OUTP and OUTN, within a narrow range of the voltage carried by signal VOCM and is shown as including amplifier 308 and resistor network 310. Transistor 202 of intermediate stage 200 forms a cascode amplifier with transistor 104 of input stage 100. Transistor 204 of intermediate stage 200 forms a cascode amplifier with transistor 102 of input stage 100. Transistor 206 of intermediate stage 200 forms a cascode amplifier with transistor 108 of input stage 100. Similarly, transistor 208 of intermediate stage 200 forms a cascode amplifier with transistor 106 of input stage 100.

Assume the input common mode voltage applied to input stage 100 rises due to concurrent increases in both input voltages INP and INN. This rise causes current I1 to increase and current I2 to decrease. Therefore, the collector currents of transistors 102 and 104 increase, whereas the collector currents of transistors 106 and 108 decrease. The collector current of transistor 104 is defined by a difference between currents I3 and I4 flowing in intermediate stage 200. As is seen from FIG. 2, current I3 flows through resistor 212, and current I4 flows through transistor 202. Accordingly, any increase in the collector current of transistor 104 requires a concurrent increase in current I3. Similarly, any increase in the collector current of transistor 102 requires a concurrent increase in current I5 flowing through resistor 214. In other words, as the input common mode voltage approaches the Vcc rail, currents I3 and I5 respectively flowing through resistors 212 and 214 increase, and currents I7 and I8 respectively flowing through resistors 216 and 218 decrease. Conversely, as the input common mode voltage approaches the ground potential rail, currents I3 and I5 respectively flowing through resistors 212 and 214 decrease, and currents I7 and I8 respectively flowing through resistors 216 and 218 increase.

Any increases in currents I3 and I5 increase the voltage drops across resistors 212 and 214, thereby causing the voltages at nodes N20 and N21, respectively carrying signals AP and AN, to fall. Similarly, any decreases in currents I7 and I8 decrease the voltage drops across resistors 216 and 218, thereby causing the voltages at nodes N22 and N23, respectively carrying signals BP and BN, to fall.

The collector terminals of transistors 202 and 206 are coupled to an input terminal of amplifier 306 via node N2. The collector terminals of transistors 204 and 208 are coupled to an input terminal of amplifier 304 via node N3. Amplifier 308 together with resistor network 310 form a feedback circuit 350 designed to maintain the output common mode voltage of differential amplifier 50 within a narrow range of the value carried by signal VOCM. Because the currents drawn from nodes N2 and N3 by amplifiers 306 and 304, respectively, are relatively small and considered negligible, current I4 flowing out of the collector terminal of transistor 202 substantially flows to the collector terminal of transistor 206. For the same reason, current I6 flowing out of the collector terminal of transistor 204 substantially flows to the collector terminal of transistor 208. Consequently, as the input common mode voltage of differential amplifier 50 increases, because of the increase in current I1 and a resulting decrease in the voltages at nodes N20 and N21, current I4 flowing through transistors 202 and 206 decreases, and current I6 flowing through transistors 204 and 208 also decreases.

The decreases in currents I4 and I6, in response to an increase in the input common mode voltage, cause the voltage at the base terminals of transistors 206, and 208, i.e., node N4, to fall as a consequence of (i) a decrease in current I2, which in turn, results in decreases in currents I7 and I8; and (ii) decreases in currents I4 and I6, as described above. The decrease in the base voltage of transistors 206 and 208 causes an increase in the common mode voltage of nodes N2 and N3. Accordingly, absent feedback circuit 350 of the present invention, as the input common mode voltage of differential amplifier 50 increases, so does the common mode voltage of nodes N2 and N3, and the output common mode voltage of differential amplifier 50 present between output terminals OUTP and OUTN decreases. Conversely, absent feedback circuit 350 of the present invention, as the input common mode voltage of differential amplifier 50 decreases, so does the common mode voltage of nodes N2 and N3, and the output common mode voltage of differential amplifier 50 increases.

To minimize the dependency of the output common mode voltage of differential amplifier 50 on its input common mode voltage, the common mode voltage at nodes N2 and N3, and hence the output common mode voltage of differential amplifier 50 is set to a user defined value supplied externally by signal VOCM via feedback circuit 350. Assume that the output common mode voltage, i.e., the average value of the signals OUTP and OUTN rises. This causes the voltage at node N5 disposed between resistors 312 and 314 to increase. Because node N5 is coupled to the negative input terminal of amplifier 308, the output voltage of amplifier 308 applied to the base terminals of transistors 206 and 208 decreases. Since each of transistors 206 and 208 is configured as a common-emitter amplifier, each has a negative gain. Accordingly, as the voltage at the base terminals of transistor 206 and 208 decreases, their collector voltages increase. Furthermore, since each of amplifiers 304 and 306 has a negative gain, as the collector voltages of transistor 206 and 208 increase, the output voltages of amplifiers 304 and 306 decrease thus counteracting the initial increase in the output common mode voltage of differential amplifier 50. Consequently, as described above, feedback circuit 350 is adapted to provide a feedback signal via amplifier 308 to counteract increases or decreases in the output common mode voltage of differential amplifier 50 by maintaining this voltage within a narrow range of the value carried by signal VOCM.

To reduce harmonic distortions and to further stabilize the output common mode voltage of the differential amplifier 50, current I10 is controllably drawn from biasing circuit 400 using controlled (i.e. variable) current source 410. Controlled current source 410 disposed in block 450 varies the amount of current I10 it draws from the emitter terminal of transistor 404 in response to signal Ctrl generated by sensing block 150. Controlled current source 410 reduces the amount of feedback voltage that feedback circuit 350 would otherwise be required to provide to compensate for variations of the output common mode as a result of the variations in the input common mode of differential amplifier 50.

Reference current I9 flowing through current source 406 of biasing circuit 400 is used to bias transistor 404 and to maintain its base-emitter terminal at a nearly constant value. In the absence of controlled current source 450, since the emitter voltage of transistor 404 would not change, its base voltage would also remain constant. Since the base terminals of transistors 404, 202 and 204 are connected to the same node N1, the base voltage of transistors 202 and 204 would also remain relatively constant. Therefore, for example, as the input common mode increases—resulting in the reduction of the voltages at nodes N20 and N21—because the voltage at the base terminals of transistors 202 and 204 would remain relatively unchanged, currents I4 and I6 respectively flowing through transistors 202 and 204 would decrease. In accordance with one embodiment of the present invention, controlled current circuit 410 by controllably drawing current I10 from node N6, maintains the base-emitter voltages of transistors 202 and 204 relatively constant so as to minimize large variations in currents I4 and I6, as described further below.

Current source 410 is so adapted as to draw a current I10 from node N6 that is a fraction, e.g., ½ in one embodiment, of current I1. Assume the input common mode voltage of differential amplifier 50 increases. As described above, this increase causes currents I1 to increase, in turn, causing the voltages at nodes N20 and N21 to decrease. Any increase in current I1 is followed by a proportional increase in current I10 drawn from node N6, thereby causing the voltage at node N6 to fall proportionally. Because current I9 flowing through current source 406 is nearly constant, the base-emitter voltage of transistor 404 is maintained nearly constant. Therefore, any drop in the voltage at node N6 causes a similar voltage drop at node N1 thereby to keep the base-emitter voltage of transistor 404 nearly unchanged. In other words, any change in the input common mode voltage that causes the voltages at the emitter terminals of transistor 202 or 204 to increase (or decrease), causes a similar increase (or decrease) in the base voltage of transistors 202 or 204. Consequently, currents I4 and I6 are kept relatively unchanged, thus minimizing the dependency of the output common mode voltage of differential amplifier 50 on its input common mode voltage.

Figure 3:
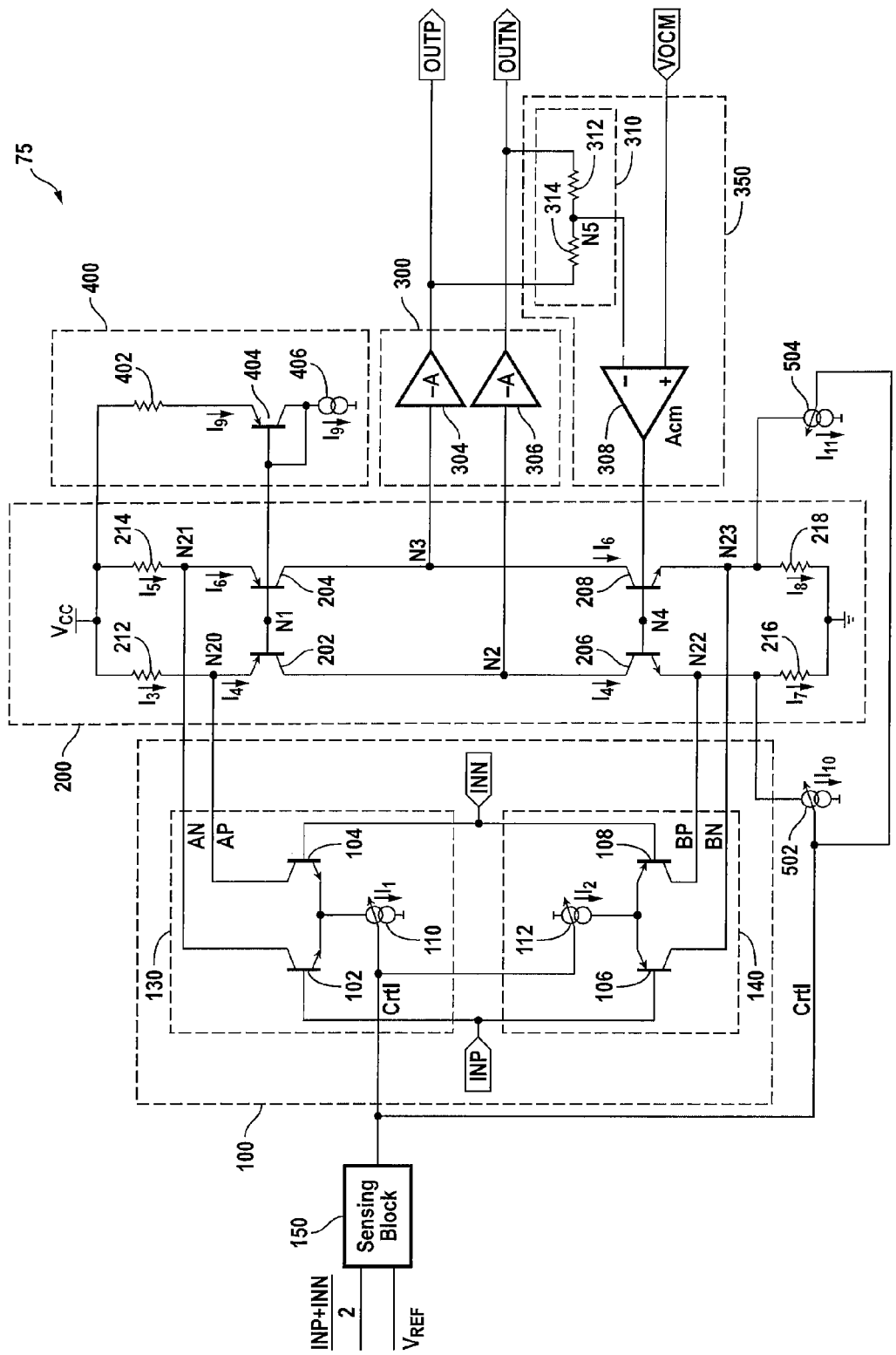
FIG. 3 is a schematic diagram of a differential amplifier with a rail-to-rail input stage, in accordance with another embodiment of the present invention.

FIG. 3 is a transistor schematic diagram of a differential amplifier 75 with a rail-to-rail input stage, in accordance with another embodiment of the present invention. Differential amplifier 75 is similar to differential amplifier 50 except that differential amplifier 75 does not include a controlled current source 410. Instead, differential amplifier 75 includes a pair of controlled current sources 502 and 504 that respectively supply currents I10 and I11 to nodes N22 and N23 in response to signal Ctrl. Controlled current sources 502 and 504 reduce harmonic distortions and further stabilize the output common mode voltage of differential amplifier 75 by reducing variations in currents I4 and I6.

Figure 4:
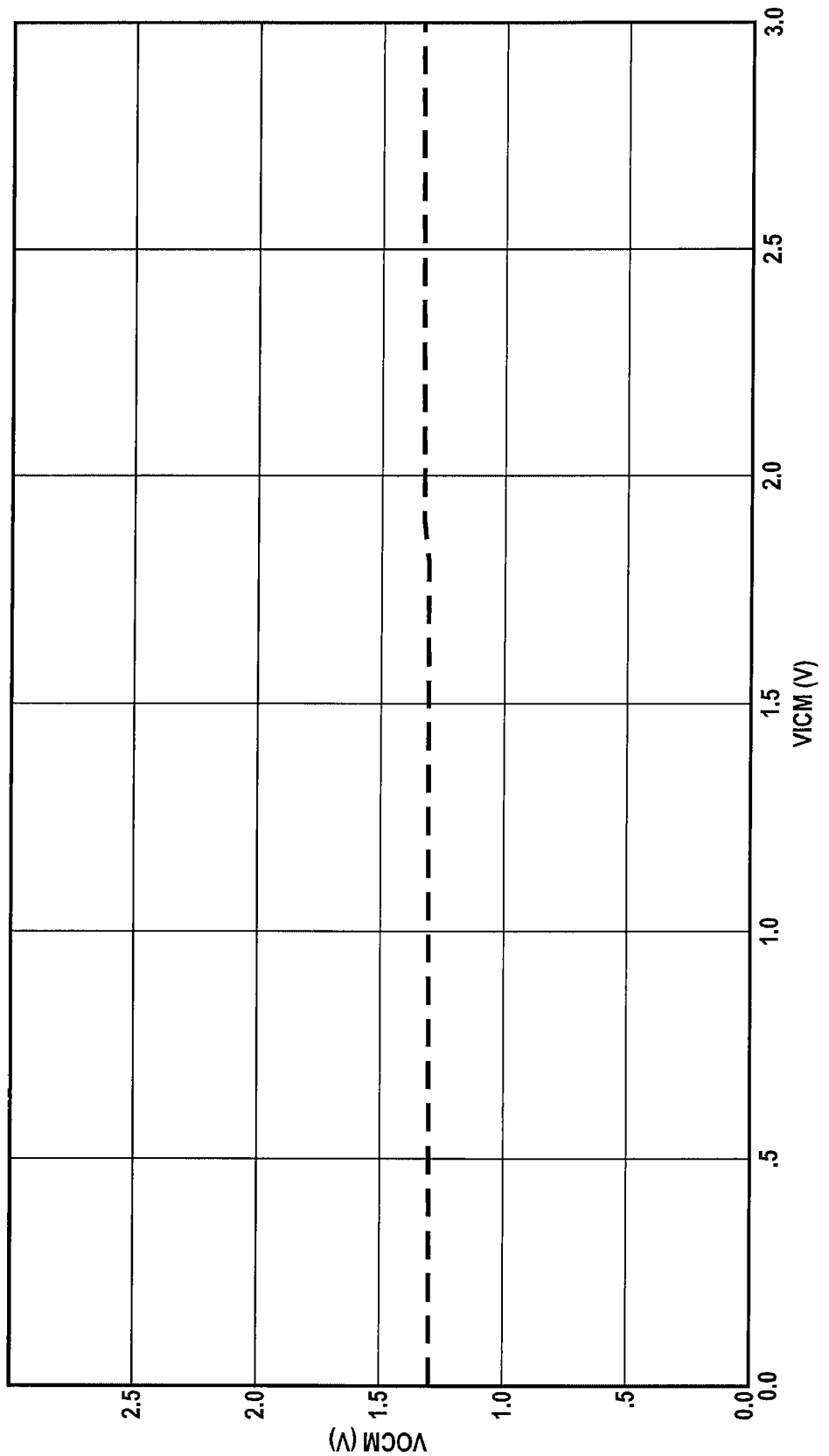
FIG. 4 is an exemplary plot of the output common mode voltage as a function of the input common mode voltage of a differential amplifier with a rail-to-rail input stage, in accordance with one embodiment of the present invention.

FIG. 4 is an exemplary plot of the output common mode voltage (VOCM) as a function of the input common mode voltage (VICM) of a differential amplifier with a rail-to-rail input stage, in accordance with any of the embodiments of the present invention described above. The VOCM is seen as remaining substantially constant, e.g., changing from 1.252V to 1.267V (ΔV=15 mV), as VICM changes from 0 to 3 volts.

The above embodiments of the present invention are illustrative and not limitative. Various alternatives and equivalents are possible. The invention is not limited by the type of transistors, bipolar, MOS or otherwise, that may be used to form the differential amplifier. Nor is the invention limited by the type of current source or amplifiers used in the rail-to-rail differential amplifier of the present invention. The invention is not limited by the type of integrated circuit in which the present disclosure may be disposed. Nor is the invention limited to any specific type of process technology, e.g., CMOS, Bipolar, BICMOS, or otherwise that may be used to form the differential amplifier of the present invention. Other additions, subtractions or modifications are obvious in view of the present invention and are intended to fall within the scope of the appended claims.

What is claimed is:

1. A differential amplifier comprising:
an input stage, said input stage comprising:
a first differential amplification stage biased by a first current source and adapted to generate a first pair of intermediate differential signals in response to a pair of differential input signals; and
a second differential amplification stage biased by a second current source and adapted to generate a second pair of intermediate differential signals in response to the pair of differential input signals;
a second stage adapted to generate a third pair of intermediate differential signals between first and second nodes responsive to the first and second pairs of intermediate differential signals;
an output stage adapted to supply a pair of differential output signal responsive to the third pair of intermediate differential signals; and
a feedback circuit adapted to supply a feedback signal to define a common mode voltage of the pair of differential output signals in accordance with an external value, wherein
said second stage comprises:
first and second transistors responsive to the first pair of intermediate differential signals; and
third and fourth transistors responsive to the second pair of intermediate differential signals; said first and third transistors being coupled to the first node and adapted to pass a substantially same first current; said second and fourth transistors being coupled to the second node and adapted to pass a substantially same second current,
each of said first and second transistors forms a cascode amplifier with a different one of the transistors disposed in the first differential amplification stage, and
each of said third and fourth transistors forms a cascode amplifier with a different one of the transistors disposed in the second differential amplification stage,
the differential amplifier further comprising a first resistive load disposed between a first supply voltage and the first transistor, and a second resistive load disposed between the first supply voltage and the second transistor.

2. The differential amplifier of claim 1 further comprising a third resistive load disposed between a second supply voltage and the third transistor, and a fourth resistive load disposed between the second supply voltage and the fourth transistor, said second supply voltage being smaller than said first supply voltage.

3. The differential amplifier of claim 2 wherein said first and second current sources are variable current source, the differential amplifier further comprising:
a sensing block adapted to generate a control signal operative to vary the currents flowing through the first and second current sources in response to variations in the common mode of the differential input signals such that a sum of the currents flowing through the first and second current sources remains substantially constant.

4. The differential amplifier of claim 3 wherein said output stage comprises:
a first amplifier having a negative gain and generating a first one of the pair of differential output signals at its output terminal in response to the voltage of the first node; and
a second amplifier having a negative gain and generating a second one of the pair of differential output signals at its output terminal in response to the voltage of the second node.

5. The differential amplifier of claim 4 wherein said feedback circuit comprises:
a resistive network coupled to output terminals of the first and second amplifiers and supplying a voltage representative of a common mode voltage of the pair of differential output signals; and
a third amplifier adapted to supply the feedback signal in response to the voltage supplied by the resistive network and the external value.

6. The differential amplifier of claim 5 wherein the first differential amplification stage includes a pair of bipolar NPN transistors coupled at their respective emitter terminals.

7. The differential amplifier of claim 6 wherein the second differential amplification stage includes a pair of bipolar PNP transistors coupled at their respective emitter terminals.

8. The differential amplifier of claim 7 wherein each of the first and second transistors is a bipolar PNP transistor, said first PNP transistor having an emitter terminal coupled to a first terminal of the first resistive load and a collector terminal coupled to the first node, said second PNP transistor having an emitter terminal coupled to a first terminal of the second resistive load and a collector terminal coupled to the second node, said first and second transistors having a common base terminal.

9. The differential amplifier of claim 8 wherein each of the third and fourth transistors is a bipolar NPN transistor, said third NPN transistor having an emitter terminal coupled to a first terminal of the third resistive load and a collector terminal coupled to the first node, said fourth NPN transistor having an emitter terminal coupled to a first terminal of the fourth resistive load and a collector terminal coupled to the second node, said third and fourth transistors having a common base terminal configured to receive the feedback signal.

10. The differential amplifier of claim 9 further comprising:
a fifth transistor having a collector terminal coupled to a third current source, a base terminal coupled to the base terminals of the first and second transistors and to the collector terminal of the fifth transistor, and an emitter terminal coupled to a first terminal of a fifth resistive load whose second terminal is coupled to the first supply voltage; and
a third variable current source adapted to draw current from the emitter terminal of the fifth transistor in response to the control signal, wherein a current flowing through the third variable current source is a fraction of the current flowing through the first variable current source.

11. The differential amplifier of claim 9 further comprising:
a third variable current source adapted to supply a third current to the emitter terminal of the third transistor in response to the control signal; and
a fourth variable current source adapted to supply a fourth current to the emitter terminal of the fourth transistor in response to the control signal.

12. The differential amplifier of claim 9 wherein said external value is user defined.

13. A method of controlling an output common mode voltage of a differential amplifiers the method comprising:
generating first and second currents;
generating a first voltage in response to first portions of the first and second currents;
generating a second voltage in response to second portions of the first and second currents;
generating a third voltage defining a first one of a pair of differential output signals in response to the first voltage;
generating a fourth voltage defining a second one of a pair of differential output signals in response to the second voltage;
generating a feedback signal adapted to maintain a common mode voltage of the pair of differential output signals in accordance with an externally defined value; and
varying the first and second currents in response to a control signal such that a sum of the first and second currents remains substantially unchanged.

14. The method of claim 13 further comprising:
passing a third current through first and third transistors coupled to a first node supplying the first voltage, said third current being defined by the first portions of the first and second currents; and
passing a fourth current through second and fourth transistors coupled to a second node supplying the second voltage, said fourth current being defined by the second portions of the first and second currents.

15. The method of claim 14 further comprising:
maintaining a substantially constant voltage across a pair of terminals of the first transistor; and
maintaining a substantially constant voltage across a pair of terminals of the second transistor.

16. The method of claim 15 further comprising:
forming a cascode amplifier between each of the first, second, third and fourth transistors and a different one of transistors receiving the pair of differential input signals.

17. The method of claim 16 wherein said first, second, third and fourth transistors are bipolar transistors, the method further comprising:
coupling a base terminal of a fifth transistor to the base terminals of the first and second transistors; and
maintaining a substantially constant voltage across base-emitter terminals of the fifth transistor.

18. The method of claim 17 further comprising:
varying the amount of current drawn from the emitter terminal of the fifth transistor in accordance with the input common mode voltage.

19. The method of claim 18 wherein the amount of current drawn from the emitter terminal of the fifth transistor is a predefined fraction of the first current.

20. The method of claim 17 further comprising:
supplying a fifth current to the emitter terminal of the third transistor in response to the input common mode voltage; and
supplying a sixth current to the emitter terminal of the fourth transistor in response to the input common mode voltage.

21. A differential amplifier comprising:
an input stage, said input stage comprising:
a first differential amplification stage biased by a first current source and adapted to generate a first pair of intermediate differential signals in response to a pair of differential input signals; and
a second differential amplification stage biased by a second current source and adapted to generate a second pair of intermediate differential signals in response to the pair of differential input signals;
a second stage adapted to generate a third pair of intermediate differential signals between first and second nodes responsive to the first and second pairs of intermediate differential signals;
an output stage adapted to supply a pair of differential output signal responsive to the third pair of intermediate differential signals; and
a feedback circuit adapted to supply a feedback signal to define a common mode voltage of the pair of differential output signals in accordance with an external value, wherein
said output stage comprises:
a first amplifier having a negative gain and generating a first one of the pair of differential output signals at its output terminal in response to the voltage of the first node; and
a second amplifier having a negative gain and generating a second one of the pair of differential output signals at its output terminal in response to the voltage of the second node.

22. A differential amplifier comprising:
an input stage, said input stage comprising:
a first differential amplification stage biased by a first current source and adapted to generate a first pair of intermediate differential signals in response to a pair of differential input signals; and
a second differential amplification stage biased by a second current source and adapted to generate a second pair of intermediate differential signals in response to the pair of differential input signals;
a second stage adapted to generate a third pair of intermediate differential signals between first and second nodes responsive to the first and second pairs of intermediate differential signals;
an output stage adapted to supply a pair of differential output signal responsive to the third pair of intermediate differential signals; and a feedback circuit adapted to supply a feedback signal to define a common mode voltage of the pair of differential output signals in accordance with an external value, wherein said first and second current sources are variable current sources, the differential amplifier further comprising:

a sensing block adapted to generate a control signal operative to vary the currents flowing through the first and second current sources in response to variations in the common mode of the differential input signals such that a sum of the currents flowing through the first and second current sources remains substantially constant.

23. The method of claim 13 wherein the control signal depends on a common mode voltage of a pair of differential input signals.

\* \* \* \* \*